(12) United States Patent
Chang et al.

(10) Patent No.: US 11,876,189 B2
(45) Date of Patent: Jan. 16, 2024

(54) BATTERY SYSTEM, BATTERY MODULE AND BATTERY CONTROL CIRCUIT THEREOF

(71) Applicant: RICHTEK TECHNOLOGY CORPORATION, Zhubei (TW)

(72) Inventors: Wei-Hsu Chang, Hsinchu (TW); Hao-Wen Chung, Hsinchu (TW); Chung-Hui Yeh, Hsinchu (TW); Kuo-Chen Tsai, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 764 days.

(21) Appl. No.: 16/781,453

(22) Filed: Feb. 4, 2020

(65) Prior Publication Data
US 2020/0303785 A1    Sep. 24, 2020

Related U.S. Application Data

(60) Provisional application No. 62/821,317, filed on Mar. 20, 2019.

(30) Foreign Application Priority Data

Aug. 19, 2019 (TW) ................. 108129495

(51) Int. Cl.
*H01M 10/42* (2006.01)
*G06F 13/42* (2006.01)
(Continued)

(52) U.S. Cl.
CPC ........ *H01M 10/425* (2013.01); *G01R 31/382* (2019.01); *G01R 31/396* (2019.01);
(Continued)

(58) Field of Classification Search
CPC . H01M 2010/4271; H01M 2010/4278; H01M 10/4207; H01M 10/425; H01M 10/482; H01M 2220/20; H01M 10/0445; H01M 10/63; H01M 10/633; H01M 10/42; H01M 10/48; G01R 31/396; G01R 31/382; G06F 2213/00; G06F 2213/00016;
(Continued)

(56) References Cited

U.S. PATENT DOCUMENTS

| | | | |
|---|---|---|---|
| 8,237,405 B2 * | 8/2012 | Li | H02J 7/0047 320/116 |
| 2010/0173180 A1 | 7/2010 | Li | |
| 2015/0370312 A1 * | 12/2015 | Desposito | G06F 13/4247 713/323 |

* cited by examiner

*Primary Examiner* — Anthony R Jimenez
(74) *Attorney, Agent, or Firm* — Tung & Associates

(57) ABSTRACT

A battery module for use in a battery system is operable in a bottom mode, a top mode or a middle mode during an enabled state. The battery module includes a battery unit and a battery control circuit. The battery unit which includes at least one battery generates a battery unit voltage between a positive terminal and a negative terminal of the battery unit. The battery control circuit is powered by the battery unit voltage and is configured to control the battery unit. The battery control circuit includes an enable terminal, an upstream input terminal, an upstream output terminal, a downstream input terminal, and a downstream output terminal. When the enable terminal is at an operation enabling level, or when the upstream input terminal is at an upstream enabling level, the battery module enters the enabled state.

18 Claims, 10 Drawing Sheets

(51) Int. Cl.
*G01R 31/382* (2019.01)
*G01R 31/396* (2019.01)
*H01M 10/48* (2006.01)

(52) U.S. Cl.
CPC .... *G06F 13/4247* (2013.01); *H01M 10/4207* (2013.01); *H01M 10/482* (2013.01); *G06F 2213/0016* (2013.01); *H01M 2010/4271* (2013.01); *H01M 2010/4278* (2013.01)

(58) Field of Classification Search
CPC ........ G06F 13/4247; G06F 13/42; H02J 1/00; H02J 7/00
USPC ............................................................ 429/7
See application file for complete search history.

BATTERY SYSTEM, BATTERY MODULE AND BATTERY CONTROL CIRCUIT THEREOF

CROSS REFERENCE

The present invention claims priority to U.S. 62/821,317, filed on Mar. 20, 2019, and TW 108129495, filed on Aug. 19, 2019.

BACKGROUND OF THE INVENTION

Field of Invention

The present invention relates to a battery system, particularly to a battery system which has a daisy chain topology. The present invention also relates to a battery module and a battery control circuit for use in the battery system.

Description of Related Art

The following prior art documents are relevant to the present invention: "U.S. Pat. No. 8,010,724, I2C/SMBUS Ladders and Laddered Enabled ICs"; "US patent application US 2011/0289239 A1, Device Address Assignment in a Bus Cascade System" and "US patent application US 2019/0006723 A1, Multi-Channel and Bi-directional Battery management System".

A high-power battery system (such as for use in an electric vehicle) consists of a large number of battery modules. In the battery system, the battery modules are typically connected in series to enhance the output voltage of the battery system so as to reduce the current level and the wire diameter of the power cord. In each battery module, there are plural batteries connected in series.

FIG. 1 shows a prior art battery system which has a daisy chain topology (battery system 1). The battery system 1 includes battery modules $10[1] \sim 10[n]$ which are coupled to form a daisy chain. The battery modules $10[1] \sim 10[n]$ include corresponding battery units (battery units $12[1] \sim 12[n]$) and corresponding battery control circuits (battery control circuits $11[1] \sim 11[n]$). Each battery control circuit is configured to operably control its corresponding battery unit, such as to perform over voltage protection in charging operation or to perform under voltage protection in discharging operation. In a configuration wherein the battery unit includes plural batteries, the corresponding battery control circuit performs a voltage balancing control among the batteries of the battery unit. Besides, the battery control circuits provide a communication function among the battery modules which are coupled to form the daisy chain. In the configuration of the daisy chain, the battery modules can operate in different identification modes. For example, one can operate in the top mode (e.g. battery module $10[n]$ in FIG. 1), the middle mode (e.g. battery modules $10[2] \sim 10\ [n-1]$ in FIG. 1) or the bottom mode (e.g. battery module $10[1]$ in FIG. 1).

FIG. 2 shows a prior art battery module which can be coupled to other battery modules to form a daisy chain. The enable terminal EN of the battery control circuit 11 sets up an enabled state or a disabled state of the battery module. Specifically, a low-quiescent current power supply 111 converts the battery unit voltage VBM[$i$] (generated by battery unit 12[$i$], wherein i=1~n) to a first power, and the internal power supply 112 converts the battery unit voltage VBM [$i$] to a second power only during the enabled state (EN=enabling level). The first power provides the power that the internal circuits need when the battery module 10 is in the disabled state; the second power provides the power that the other circuits need when the battery module 10 is in the enabled state. The quiescent current of the low-quiescent current power supply 111 is very low, so that it can maintain operation for a long time when the battery module 10 is during the disabled state.

The prior art shown in FIG. 1 and FIG. 2 has the following drawbacks. First, the identification mode of each battery module has to be individually set up into the corresponding battery control circuit, which is time consuming and costly. Second, the enabled state or the disabled state of the battery module is set up by the enable terminal EN of the corresponding battery control circuit. However, the battery modules are each powered by a different battery unit voltage (VBM[1]~VBM[$n$]), whereby the absolute voltage value of the logic level of each battery module may be different from another. As a result, it is required to use isolated signal conversion elements (e.g. transformers) or signal level shift circuits to convert the enabling signal EN [1] provided by the master control circuit 20 to the enabling signals EN[2]-EN[$n$], which greatly increase the manufacturing cost of the battery system 1.

Compared with the prior art of FIG. 1, the present invention can set up the enabled state and the disabled state of each of the battery modules by daisy chain communication method, and does not need the isolated signal conversion elements or the signal level shift circuits. Besides, the present invention can determine the identification mode of each battery module by the daisy chain communication method so that it is not required to set up the battery control circuits individually.

SUMMARY OF THE INVENTION

From one perspective, the present invention provides a battery module, for use in a battery system which is configured to operate in a bottom mode or a top mode during an enabled state, the battery module comprising: a battery unit, including at least one battery, wherein the battery unit generates a battery unit voltage between a positive terminal and a negative terminal of the battery unit; and a battery control circuit, powered by the battery unit voltage and configured to operably detect the battery unit voltage and/or to control the battery unit, wherein the battery control circuit includes an enable terminal, an upstream input terminal, an upstream output terminal, a downstream input terminal, and a downstream output terminal, and when the enable terminal is at an operation enabling level, or when the upstream input terminal is at an upstream enabling level, the battery module enters the enabled state.

In one embodiment, the battery module enters a mode determining step in the enabled state, wherein in the mode determining step: when the enable terminal is at the operation enabling level and the upstream input terminal is at an upstream disabling level, the battery module is determined operating in the bottom mode; or when the enable terminal is at an operation disabling level, the upstream input terminal is at the upstream enabling level, and the downstream input terminal is at a downstream enabling level, the battery module is determined operating in the top mode.

In one embodiment, the battery module is further configured to be operable in a middle mode during the enabled state, wherein in the mode determining step: when the enable terminal is at the operation disabling level, the upstream input terminal is at the upstream enabling level, and the downstream input terminal is at a downstream disabling level, the battery module is determined operating in the middle mode.

In one embodiment, after the mode determining step, the battery control circuit conducts a daisy chain upstream step and a daisy chain downstream step; wherein in the daisy chain upstream step, when the battery module operates in the bottom mode or the middle mode, the upstream output terminal switches to the upstream enabling level; after the daisy chain upstream step, the battery control circuit conducts the daisy chain downstream step; wherein in the daisy chain downstream step: when the battery module operates in the top mode, the downstream output terminal switches to the downstream enabling level; or when the battery module operates in the middle mode, and the downstream input terminal is at a downstream enabling level, the downstream output terminal switches to the downstream enabling level.

In one embodiment, wherein the battery module is further configured to be operable in a stand-alone mode during the enabled state, wherein in the mode determining step: when the enable terminal is at the operation enabling level, and the upstream input terminal is at the upstream enabling level, the battery module is determined operating in the stand-alone mode.

In one embodiment, the battery unit includes plural batteries which are connected in series, wherein the battery control circuit performs a voltage balancing control to the batteries of the battery unit, such that the batteries of the battery unit achieve a voltage-balanced state.

In one embodiment, the battery unit includes plural batteries which are connected in series, wherein the battery control circuit monitors a voltage of each battery of the battery unit, and when at least one battery of the battery unit has a voltage higher than a voltage upper limit or lower than a voltage lower limit, the battery control circuit generates a protection signal; wherein the battery control circuit transmits the protection signal to a battery module which is in the bottom mode through the downstream input terminal(s) and the downstream output terminal(s) to turn off an electrical connection between the battery system and the exterior of the battery system; or the battery control circuit transmits the protection signal to a battery module which is in the top mode through the upstream input terminal(s) and the upstream output terminal(s) to turn off an electrical connection between the battery system and the exterior of the battery system.

In another aspect, the present invention provides a battery system, comprising plural battery modules which operate respectively in a bottom mode, a top mode and at least one middle mode during an enabled state, wherein each battery module includes: a battery unit, including at least a battery, wherein the battery unit generates a battery unit voltage between a positive terminal and a negative terminal of the battery unit; and a battery control circuit, powered by the battery unit voltage and configured to operably detect the battery unit voltage and/or to control the battery unit, wherein the battery control circuit includes an enable terminal, an upstream input terminal, an upstream output terminal, a downstream input terminal, and a downstream output terminal, and when the enable terminal is at an operation enabling level, or when the upstream input terminal is at an upstream enabling level, the battery module enters the enabled state; wherein the battery module enters a mode determining step during the enabled state, wherein in the mode determining step: when the enable terminal is at the operation enabling level and the upstream input terminal is at an upstream disabling level, it is determined that the battery module operates in the bottom mode; when the enable terminal is at an operation disabling level, the upstream input terminal is at the upstream enabling level, and the downstream input terminal is at a downstream enabling level, it is determined that the battery module operates in the top mode; or when the enable terminal is at the operation disabling level, the upstream input terminal is at the upstream enabling level, and the downstream input terminal is at a downstream disabling level, it is determined that the battery module operates in the middle mode; wherein after the mode determining step, the battery control circuit conducts a daisy chain upstream step and a daisy chain downstream step; wherein in the daisy chain upstream step, when the battery module operates in the bottom mode and the middle mode, the upstream output terminal switches to the upstream enabling level; after the daisy chain upstream step, the battery control circuit conducts the daisy chain downstream step; wherein in the daisy chain downstream step: when the battery module operates in the top mode, the downstream output terminal switches to the downstream enabling level; or when the battery module operates in the middle mode, and the downstream input terminal is at a downstream enabling level, the downstream output terminal switches to the downstream enabling level; wherein the bottom battery module, the at least one middle battery module and the top battery module are coupled in sequence to form a daisy chain; wherein in the bottom battery module and at least one middle battery module, the upstream output terminal of each battery control circuit is coupled to the upstream input terminal of a neighboring battery control circuit in the upstream direction; wherein in the top battery module and at least one middle battery module, the downstream output terminal of each battery control circuit is coupled to the downstream input terminal of a neighboring battery control circuit in the downstream direction; wherein all the battery units of the plural battery modules are connected in series to generate a battery system voltage between a battery output positive terminal and a battery output negative terminal of the battery system; wherein the battery control circuit of the bottom battery module corresponds to the bottom battery control circuit, and the enable terminal of the bottom battery control circuit is configured to receive a daisy chain starting signal from a master control circuit, wherein when the daisy chain starting signal switches to the operation enabling level, a daisy chain enabling procedure is started; and the upstream input terminal of the bottom battery control circuit is coupled to a reference voltage which is at the upstream disabling level; wherein after each battery module of the battery system finishes the mode determining step, the upstream step and the downstream step, the bottom battery control circuit informs the master control circuit, thereby finishing the daisy chain enabling procedure.

In another aspect, the present invention provides a battery system, comprising plural battery modules which operate respectively in a bottom mode and a top mode during an enabled state, wherein each of the battery modules includes: a battery unit, including at least one battery, wherein the battery unit generates a battery unit voltage between a positive terminal and a negative terminal of the battery unit; and a battery control circuit, powered by the battery unit voltage and configured to operably detect the battery unit voltage and/or to control the battery unit, wherein the battery control circuit includes an enable terminal, an upstream input terminal, an upstream output terminal, a downstream input terminal, and a downstream output terminal, and when the enable terminal is at an operation enabling level, or when the upstream input terminal is at an upstream enabling level, the battery module enters the enabled state; wherein the battery module enters a mode determining step during the enabled state, wherein in the mode determining step: when the enable terminal is at the operation enabling level and the upstream input terminal is at an upstream disabling level, the battery module is determined operating in the bottom mode; when the enable terminal is at an operation disabling level, the upstream input terminal is at the upstream enabling level, and the downstream input terminal is at a downstream enabling level, the battery module is determined operating in the top mode; or when the enable terminal is at the operation disabling level, the upstream input terminal is at the upstream enabling level, and the downstream input terminal is at a downstream disabling level, the battery module is determined operating in the middle mode; wherein after the mode determining step, the battery control circuit conducts a daisy chain upstream step and a daisy chain downstream step; wherein in the daisy chain upstream step, when the battery module operates in the bottom mode and the middle mode, the upstream output terminal switches to the upstream enabling level; after the daisy chain upstream step, the battery control circuit conducts the daisy chain downstream step; wherein in the daisy chain downstream step: when the battery module operates in the top mode, the downstream output terminal switches to the downstream enabling level; or when the battery module operates in the middle mode, and the downstream input terminal is at a downstream enabling level, the downstream output terminal switches to the downstream enabling level; wherein the battery control circuit of the top battery module corresponds to a top battery control circuit, wherein the battery control circuit of the bottom battery module corresponds to a bottom battery control circuit; wherein the bottom battery module and the top battery module are coupled to form a daisy chain; wherein the upstream output terminal of the bottom battery control circuit is coupled to the upstream input terminal of the top battery control circuit; wherein the downstream output terminal of the top battery control circuit is coupled to the downstream input terminal of the bottom battery control circuit; wherein the battery units of the plural battery modules are connected in series to generate a battery system voltage between a battery output positive terminal and a battery output negative terminal of the battery system; wherein the enable terminal of the bottom battery control circuit is configured to receive a daisy chain starting signal from a master control circuit, wherein when the daisy chain starting signal switches to the operation enabling level, a daisy chain enabling procedure is started; and the upstream input terminal of the bottom battery control circuit is coupled to a reference voltage which is at the upstream disabling level; wherein after each battery module of the battery system finishes the mode determining step, the upstream step and the downstream step, the bottom battery control circuit informs the master control circuit, thereby finishing the daisy chain enabling procedure.

In another aspect, the present invention provides a battery control circuit, for use in a battery module which is configured to be operable in a bottom mode or a top mode during an enabled state, wherein the battery module includes a battery unit which includes at least one battery, wherein the battery unit generates a battery unit voltage between a positive terminal and a negative terminal of the battery unit; wherein the battery control circuit is characterized in that: the battery control circuit is powered by the battery unit voltage and configured to operably detect the battery unit voltage and/or to control the battery unit; and the battery control circuit includes an enable terminal, an upstream input terminal, an upstream output terminal, a downstream input terminal, and a downstream output terminal, and when the enable terminal is at an operation enabling level, or when the upstream input terminal is at an upstream enabling level, the battery module enters the enabled state.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1:
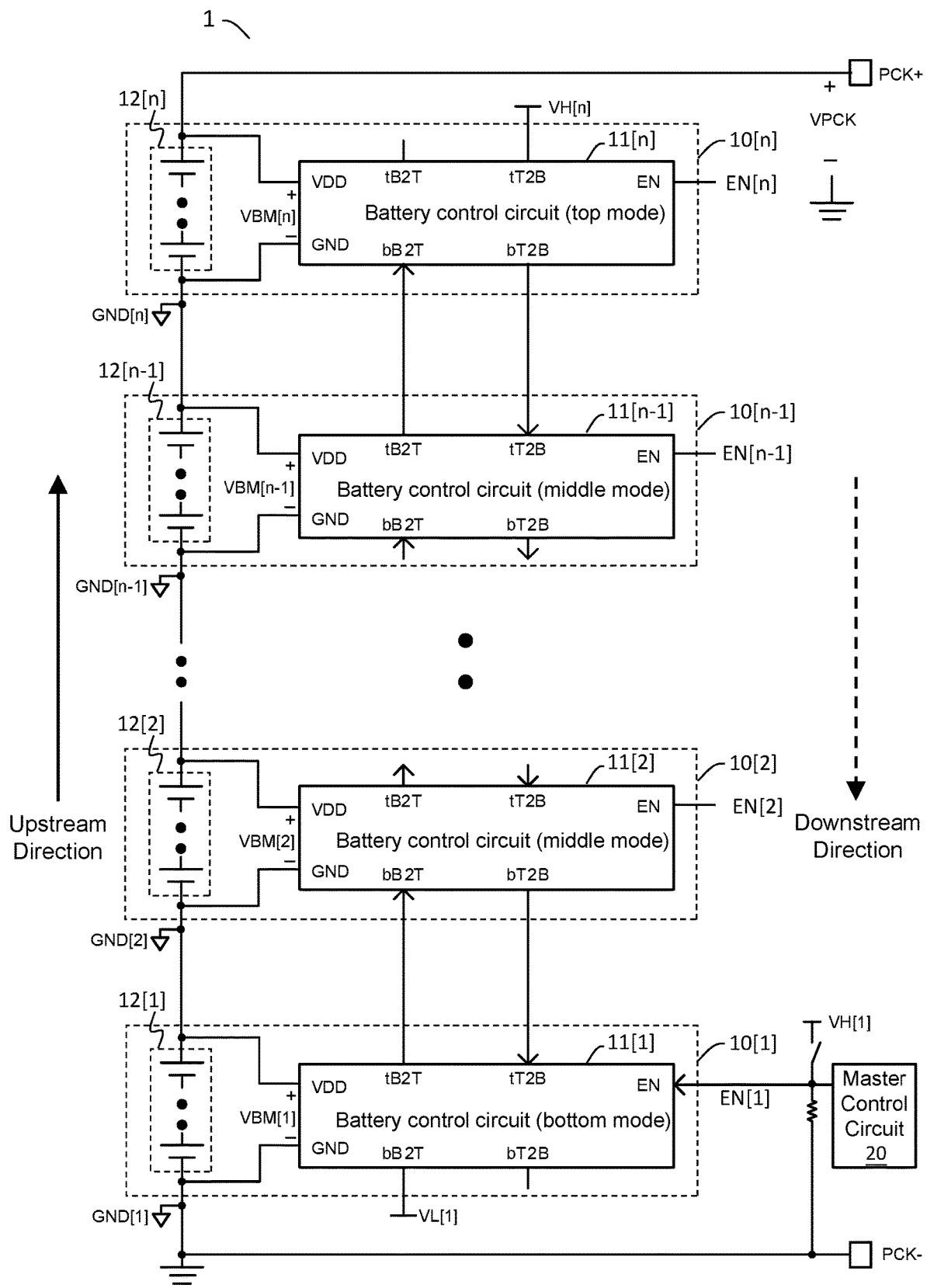
FIG. 1 shows a prior art battery system which has a daisy chain topology.
Figure 2:
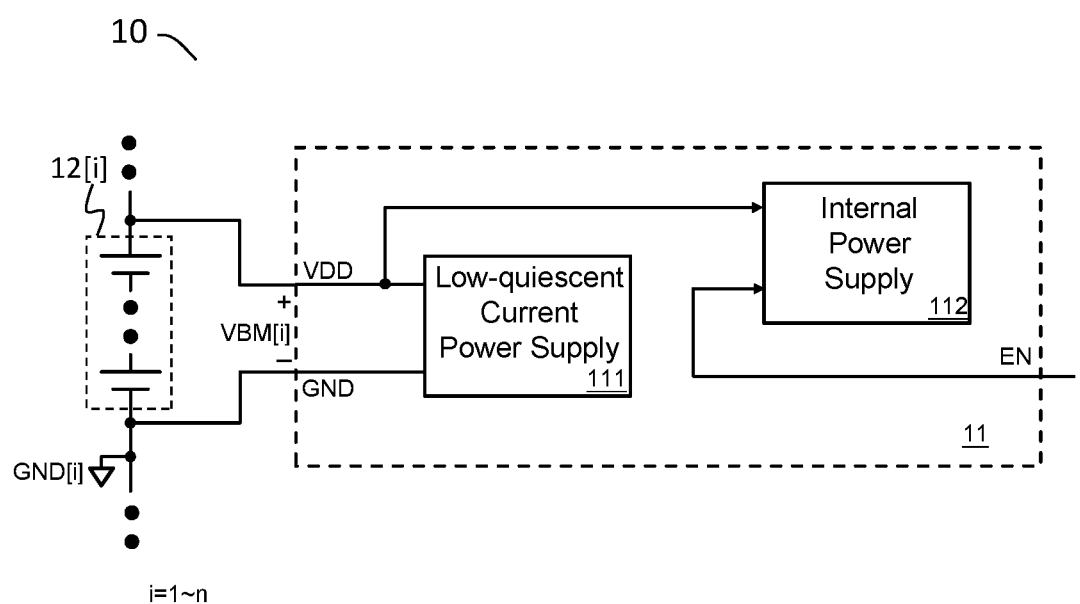
FIG. 2 shows a prior art battery module which can be coupled to other battery modules to form a daisy chain.
Figure 3:
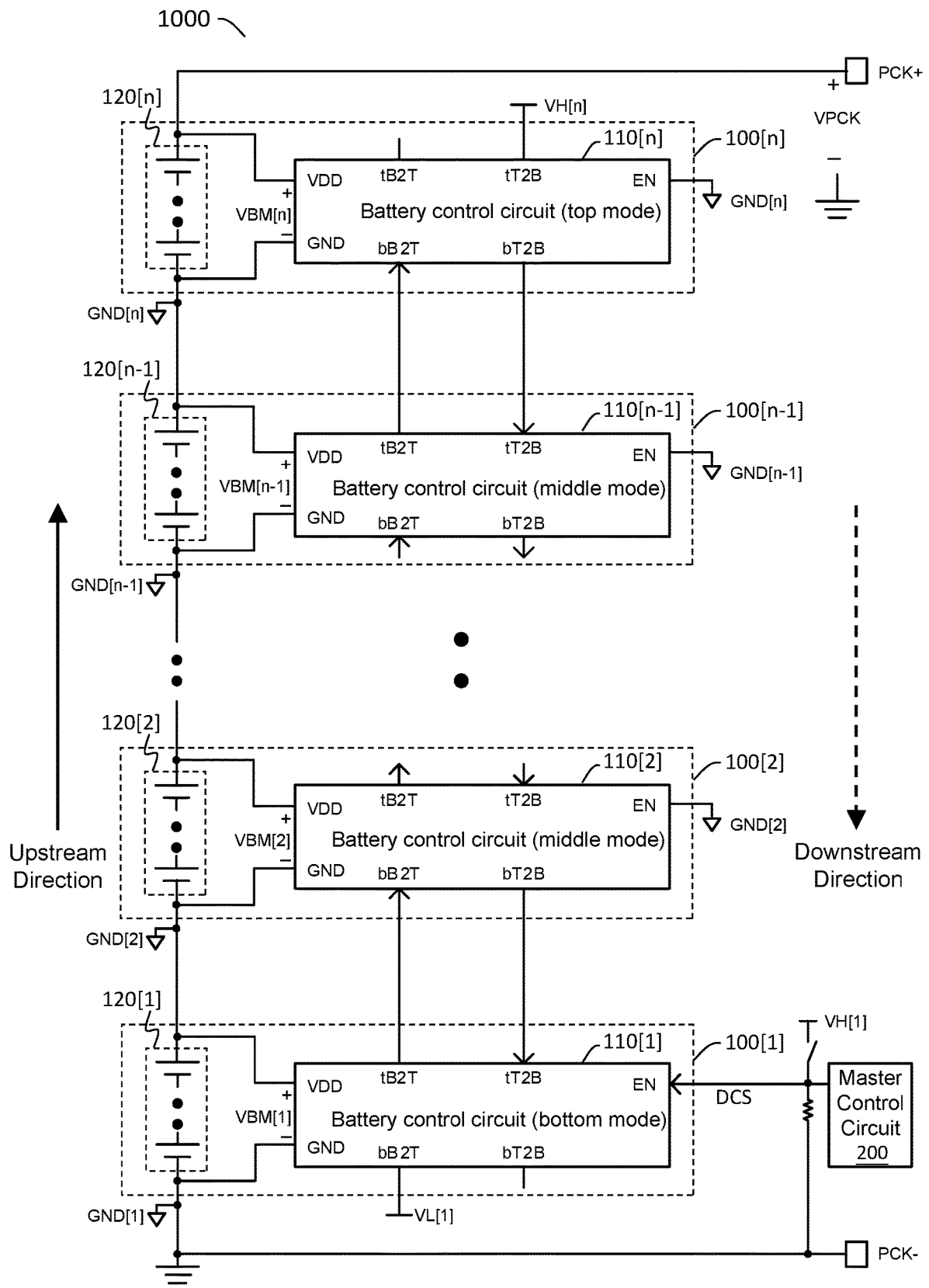
FIG. 3 shows an embodiment of a battery system according to the present invention

FIG. 3 shows an embodiment of a battery system according to the present invention (battery system 1000). In one embodiment as shown in FIG. 3, the battery system 1000 includes plural battery modules 100[1]~100[n]. The battery modules 100[1]~100[n] are arranged in a way to include a bottom battery module 100[1], a top battery module 100[n] and at least one middle battery module (e.g. 100[2]~100[n-1]).

The battery modules 100[1]~100[n] are the same in hardware aspect; during the enabled state, the same hardware but different location causes the battery modules to operate in a bottom mode (e.g. corresponding to the bottom battery module 100[1]), a top mode (e.g. corresponding to the top battery module 100[n]) or a middle mode (e.g. corresponding to the middle battery modules 100[2]~100[n-1]).

Still referring to FIG. 3, each of the battery modules (100[1]~100[n]) includes a corresponding battery unit (120[1]~120[n]) and a corresponding battery control circuit (110[1]~110[n]). In one embodiment, each battery unit includes plural batteries which are connected in series. Each of the battery units 120[1]~120[n] generates the corresponding battery unit voltage (i.e. VBM[1]~VBM[n]) between a positive terminal (which is coupled to a positive power terminal VDD) and a negative terminal (which is coupled to a negative power terminal GND) of the battery unit. In some other embodiments, a battery unit includes only one battery.

Still referring to FIG. 3, the battery control circuits 110[1]~110[n] are powered by the corresponding battery unit voltages VBM[1]~VBM[n] through the positive power terminal VDD and the negative power terminal GND, and the battery control circuits 110[1]~110[n] detect the corresponding battery unit voltages and control the corresponding battery units 120[1]~120[n]. For example, the battery control circuits perform over voltage protection in charging operation or under voltage protection in discharging operation of the corresponding battery units. In the configuration that a battery unit includes plural batteries, the battery control circuits perform voltage balancing control on the batteries of the corresponding battery units. Besides, the battery control circuits provide a communication function among the battery modules which are coupled in the form of a daisy chain.

In a specific embodiment, the battery control circuits 110[1]~110[n] conduct voltage balancing control on the batteries of the battery units 120[1]~120[n] individually, such that the batteries of the battery units 120[1]~120[n] are in a voltage-balanced state, that is, such that the batteries of any battery unit (such as battery unit 120[1]) are in a voltage-balanced state. The "voltage-balanced state" means that the voltages of the batteries of one battery unit, during charging or discharging operation, are controlled to be substantially equal. Further, in a specific embodiment, by maintaining the batteries within each of the battery units (such as battery unit 120[1]) in a voltage-balanced state, the battery unit voltages VBM[1]~VBM[n] of the plural battery units 120[1]~120[n] are in a voltage-balanced state.

Still referring to FIG. 3, according to the present invention, each of the battery control circuits includes an enable terminal EN, an upstream input terminal bB2T, an upstream output terminal tB2T, a downstream input terminal tT2B, and a downstream output terminal bT2B.

Still referring to FIG. 3, in one embodiment, the bottom battery module 100[1], the at least one middle battery module (e.g. 100[2]~100[n-1]) and the top battery module 100[n] are coupled to form a daisy chain. In the bottom battery module 100[1] and each middle battery module (e.g. 100[2]~100[n-1]), the upstream output terminal tB2T of each of the battery control circuits 110[1]~110[n-1] is coupled to the upstream input terminal bB2T of a neighboring battery control circuit in the upstream direction (as shown by the direction of solid line arrow).

Still referring to FIG. 3, in the top battery module 100[n] and each middle battery module (e.g. 100[2]~100[n-1]), the downstream output terminal bT2B of each of the battery control circuits 110[2]~110[n] is coupled to the downstream input terminal tT2B of a neighboring battery control circuit in the downstream direction (as shown by the direction of the dashed-line arrow).

All the battery units 120[1]~120[n] of the plural battery modules 100[1]~100[n] are connected in series to generate a battery system voltage VPCK between a battery output positive terminal PCK+ and a battery output negative terminal PCK− of the battery system 1000.

For convenience of description, the battery control circuit 110[1] of the bottom battery module 100[1] is referred to as the "bottom battery control circuit". The enable terminal EN of the bottom battery control circuit 110[1] receives a daisy chain starting signal DCS from a master control circuit 200. When the daisy chain starting signal DCS switches to an operation enabling level, a daisy chain enabling procedure is started. The upstream input terminal bB2T of the bottom battery control circuit 110[1] is coupled to a reference voltage (VL[1]) which is at an upstream disabling level. The details of the daisy chain enabling procedure will be described later.

Figure 4:
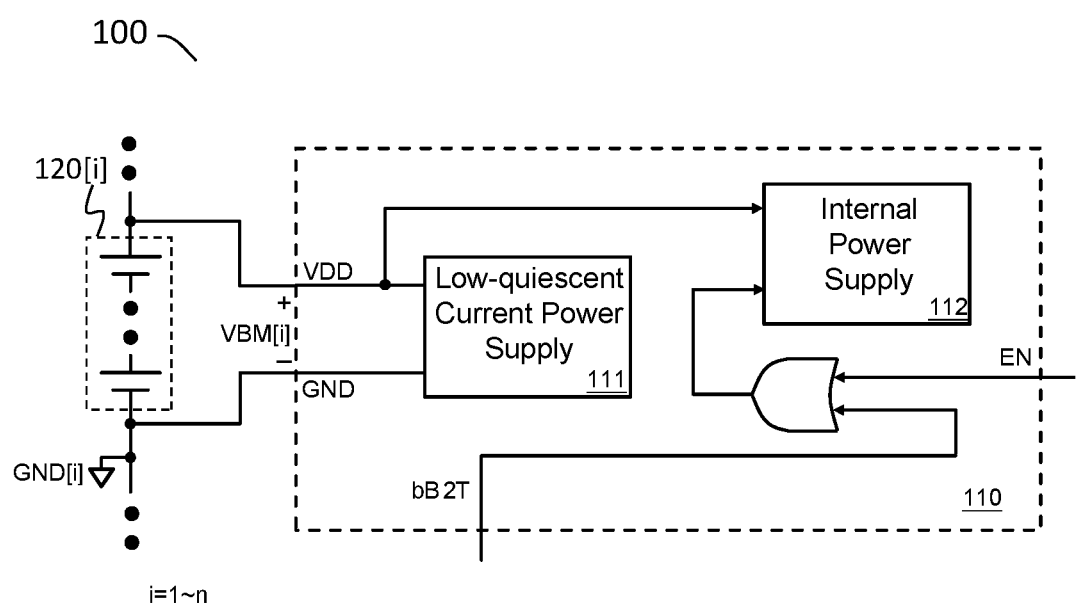
FIG. 4 shows a specific embodiment of a battery module in the battery system according to the present invention.

Please also refer to FIG. 4. FIG. 4 shows a specific embodiment of a battery module (battery module 100) in the battery system according to the present invention. In this embodiment, when the enable terminal EN is at an operation enabling level, or when the upstream input terminal bB2T is at an upstream enabling level, the corresponding battery module enters the enabled state, and then a mode determining step is performed. Specifically, a low-quiescent current power supply 111 converts the battery unit voltage VBM[i] (generated by battery unit 120[i]) to a first power; and an internal power supply 112 converts the battery unit voltage VBM [i] to a second power only during the enabled state (i.e. when the enable terminal EN is at an operation enabling level or when the upstream input terminal bB2T is at an upstream enabling level). The first power provides the power that the internal circuits need when the battery module 100 is in the disabled state (also called the delivery state); and the second power provides the power that the other circuits need when the battery module 100 is in the enabled state. The quiescent current of the low-quiescent current power supply 111 is very low, so that it can maintain operation of the battery unit 120[i] for a long time when the battery module 100 is in the disabled state.

Please note that, according to the present invention, the enabled state or the disabled state of the battery module can be controlled not only by the enable terminal EN, but also by the upstream input terminal bB2T. That is, the present invention can control the enabled state and the disabled state of each of the battery modules by daisy chain communication method, which will be described in detail later. Please also note that, in the embodiment of FIG. 3, the enable terminals EN of the battery control circuits 110[2]~110[n] are respectively coupled to the ground potentials GND[2]~GND[n] (corresponding to the operation disabling levels) of the corresponding battery units 120[2]~120[n]. That is, in this embodiment, the battery control circuits 110[2]~110 [n] control the enabled state or the disabled state of the battery module not by the corresponding enable terminal EN, but instead by the corresponding upstream input terminal bB2T. GND[1] is the ground potential of the battery unit 120[1].

On the other hand, when the enable terminal EN is at an operation disabling level and the upstream input terminal bB2T is also at an upstream disabling level, the battery module is in the disabled state. The disabled state of the battery module is also called "delivery state". That is, when a battery module has been assembled but does not need to supply power to a load (e.g. during shipment), the power consumption of the battery module can be maintained low by controlling the battery module to be in the disabled state, to extend the battery usage time, and avoid damaging the batteries in the battery module.

In one embodiment, the "operation enabling level" is for example a high logic level (i.e. "1") and the "operation disabling level" is for example a low logic level (i.e. "0"), but the present invention is not limited to this example. Similarly, the "upstream enabling level" is for example a high logic level and the "upstream disabling level" is for example a low logic level, but the present invention is also not limited to this example.

Figure 5:
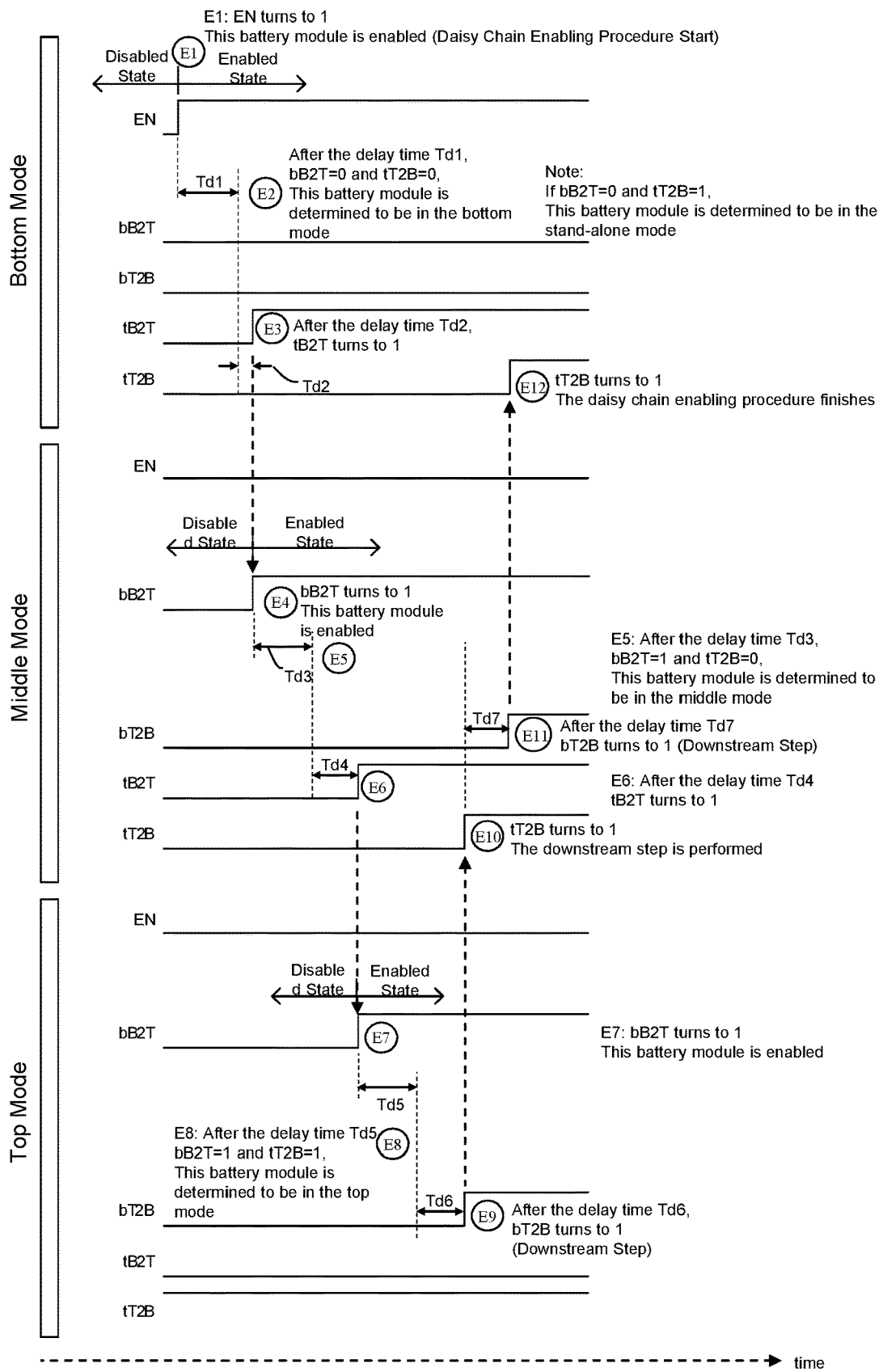
FIG. 5 shows an example of signal waveforms corresponding to the daisy chain enabling procedure of the battery system according to the present invention.
Figure 6A:
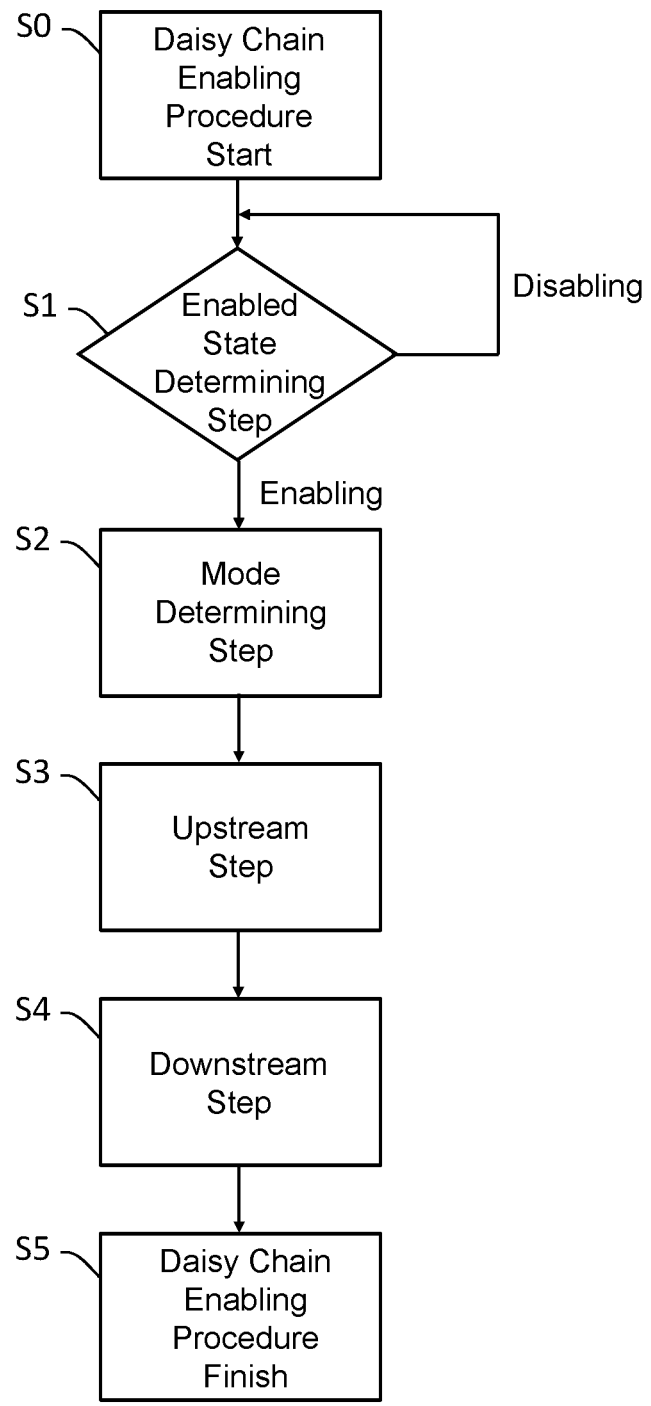
FIG. 6A shows a flow chart corresponding to the daisy chain enabling procedure of the battery system according to the present invention.

Please refer to FIG. 5 together with FIG. 6A. FIG. 5 shows an example of signal waveforms corresponding to the daisy chain enabling procedure of the battery system according to the present invention. FIG. 6A shows a flow chart corresponding to the daisy chain enabling procedure of the battery system according to the present invention.

As shown in FIG. 5 and FIG. 6A, the master control circuit 200 sends the daisy chain starting signal DCS to the enable terminal EN of the bottom battery control circuit 110[1], whereby the daisy chain enabling procedure starts (corresponding to event E1 in FIG. 5 and S0 in FIG. 6). Next, as shown in FIG. 6A, an enabled state determining step S1 is performed. In the enabled state determining step S1, if it is determined in the enabled state, a mode determining step S2 is performed; if not, it means that it is in the disabled state, and the procedure repeats the enabled state determining step S1. Next, in the mode determining step S2, it is determined which mode the battery module is in. Next, an upstream step S3 is performed. In the upstream step S3, each of the battery modules executes the corresponding step according to its mode, and the details will be described later. Next, a downstream step S4 is performed. In the downstream step S4, each of the battery modules executes the corresponding step according to its mode, and the details will be described later. Finally, the daisy chain enabling procedure finishes in step S5.

Figure 6B:
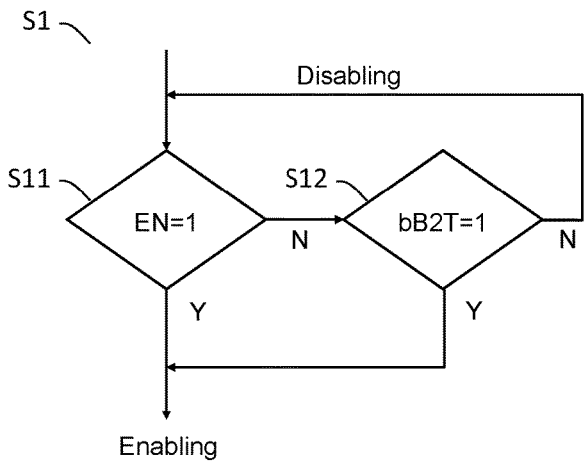
FIG. 6B-6E show specific details of the flow chart of FIG. 6A.

Please refer to FIG. 6B-6E. FIG. 6B-6E show specific details of the flow chart of FIG. 6A. As shown in FIG. 6B, in the enabled state determining step S1, each of the battery control circuits determines the state of the corresponding battery module, according to whether the enable terminal EN is at the operation enabling level (step 11). If the enable terminal EN is at the operation enabling level, it is determined that the corresponding battery module enters the enabled state. If the enable terminal EN is at the operation disabling level, it is further determined whether the upstream input terminal bB2T is at the upstream enabling level (step 12). If the upstream input terminal bB2T is at the upstream enabling level, it is determined that the corresponding battery module enters the enabled state.

Figure 6C:
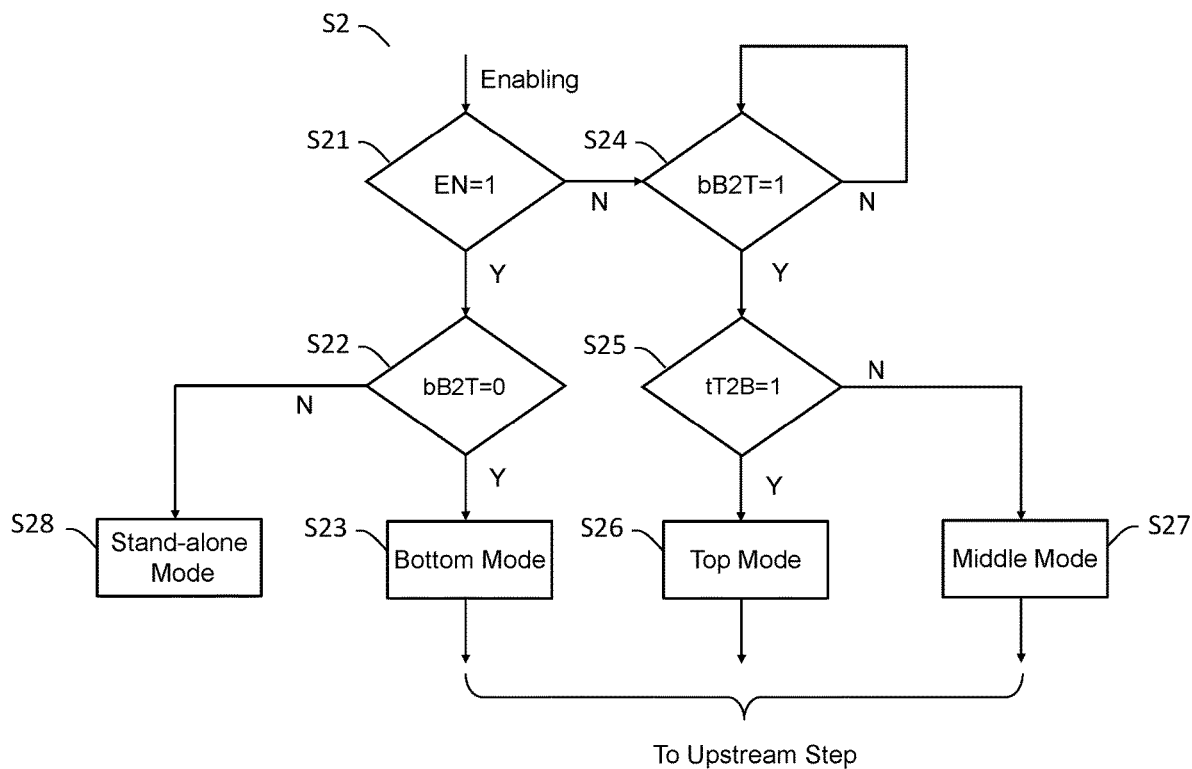

Please refer to FIG. 5 together with FIG. 6C. When the battery system 1000 is at the enabled state, the mode determining step S2 is performed as the following:

(1) when the enable terminal EN is at the operation enabling level (step 21) and the upstream input terminal bB2T is at the upstream disabling level (step 22), it is determined that the battery module operates in the bottom mode (step 23). For example, please refer to the battery module 100[1] in FIG. 3 together with the signal waveforms corresponding to the bottom mode in FIG. 5; when the upstream input terminal bB2T of the battery control circuit 110[1] is at the upstream disabling level (i.e. VL[1]), it is determined that the battery module 100[1] operates in the bottom mode.

(2) when the enable terminal EN is at the operation disabling level, the upstream input terminal bB2T is at the upstream enabling level (step 24), and the downstream input terminal tT2B is at the downstream disabling level (step 25), it is determined that the battery module operates in the middle mode (step 27). For example, please refer to the battery module 100[2] in FIG. 3 together with the signal waveforms corresponding to the middle mode in FIG. 5; when the upstream input terminal bB2T of the battery control circuit 110[2] is at the upstream enabling level (such as event E4, the battery control circuit 110[2] is actually enabled by its upstream input terminal bB2T), and the downstream input terminal tT2B is at the downstream disabling level (such as event E5, other battery modules in the upstream direction are not enabled), it is determined that the battery module 100[2] operates in the middle mode.

Or, (3) when the enable terminal EN is at the operation disabling level, the upstream input terminal bB2T is at the upstream enabling level (step S24), and the downstream input terminal tT2B is at the downstream enabling level (step 25), it is determined that the battery module operates in the top mode (step 26). For example, please refer to the battery module 100[$n$] in FIG. 3 together with the signal waveforms corresponding to the top mode in FIG. 5; when the upstream input terminal bB2T of the battery control circuit 110[$n$] is at the upstream enabling level (such as event E7, the battery control circuit 110[$n$] is actually enabled by its upstream input terminal bB2T), and the downstream input terminal tT2B is at the downstream enabling level (such as the event E8, in an embodiment of the present invention, the downstream input terminal tT2B of the battery control circuit 110[$n$] in the top mode is set to the downstream enabling level (e.g. VH[$n$])), it is determined that the battery module operates in the top mode.

Note that in one embodiment, when the battery module is determined being enabled, the mode determining step will be conducted after a delay time. Specifically, referring to the embodiment of FIG. 5, when the battery module is determined being enabled (event E1), the mode determining step will be conducted after the delay time Td1. In another embodiment, when the middle battery module or the top battery module is determined enabling respectively (event E4 or E7), the mode determining step will be conducted after the delay time Td3 or Td5 (event E5 or E8).

Similar to the above, the "downstream enabling level" is for example a high logic level and the "downstream disabling level" is for example a low logic level, but the present invention is not limited to this example. Please also note that, in the embodiment shown in FIG. 5, only one battery module operates in the middle mode, but the present invention is not limited to this and there can be plural battery modules operating in the middle mode.

Figure 6D:
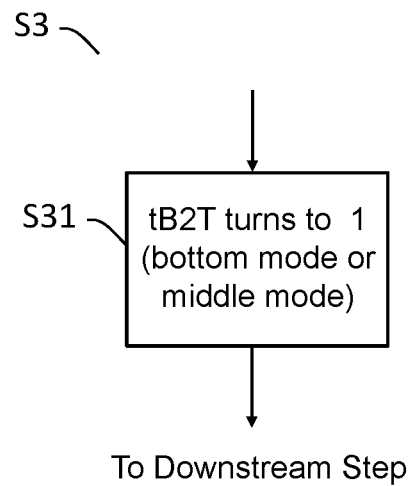

Still referring to FIGS. 3, 5 and 6D, after the mode determining step, the battery control circuit conducts a daisy chain upstream step. In the daisy chain upstream step, when the battery module operates in the bottom mode or the middle mode, the upstream output terminal tB2T switches to the upstream enabling level (step 31).

For example, please refer to the battery module 100[1] in FIG. 3 together with the signal waveforms corresponding to the bottom mode in FIG. 5. When the battery module operates in the bottom mode, in the daisy chain upstream step, the upstream output terminal tB2T of the battery module 100[1] switches to the upstream enabling level (event E3). On the other hand, please refer to the battery module 100[2] in FIG. 3 together with the signal waveforms corresponding to the middle mode in FIG. 5. When the battery module operates in the middle mode, in the daisy chain upstream step, the upstream output terminal tB2T of the battery module 100[2] switches to the upstream enabling level (event E6).

Please note that, in one embodiment, when the mode determining step finishes, the daisy chain upstream step will be conducted after a delay time. Specifically, referring to the embodiment of FIG. 5, when the battery module is determined to be in the bottom mode (event E2) or in the middle mode (event E5), the upstream output terminal tB2T of the corresponding battery module will switch to the upstream enabling level (event E3 or E6) after the delay time Td2 or Td4.

Figure 6E:
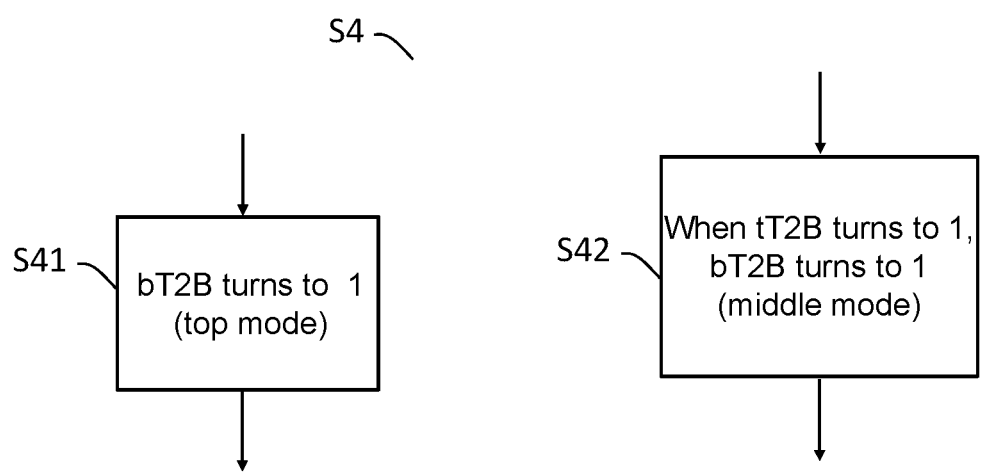

Still referring to FIGS. 3, 5 and 6E, after the daisy chain upstream step, the battery control circuit (110[1]~110 [$n$]) conducts the daisy chain downstream step.

In the daisy chain downstream step, when the battery module operates in the top mode, the downstream output terminal bT2B switches to the downstream enabling level (step S41). On the other hand, in the daisy chain downstream step, when the battery module operates in the middle mode, and the downstream input terminal tT2B is at the downstream enabling level, the downstream output terminal bT2B switches to the downstream enabling level (step S42).

For example, please refer to the battery module 100[n] in FIG. 3 together with the signal waveforms corresponding to the top mode in FIG. 5. When the battery module operates in the top mode (corresponding to the battery module 100[n]), in the daisy chain downstream step, the downstream output terminal bT2B of the battery module 100[n] switches to the downstream enabling level (event E9).

On the other hand, please refer to the battery module 100[2] in FIG. 3 together with the signal waveforms corresponding to the middle mode in FIG. 5. When the battery module operates in the middle mode (corresponding to the battery module 100[2]), in the daisy chain downstream step, after the downstream input terminal tT2B of the battery module 100[2] switches to the downstream enabling level (event E10), the downstream output terminal bT2B of the battery module 100[2] switches to the downstream enabling level (event E11). On the other hand, please refer to the battery module 100[1] in FIG. 3 together with the signal waveforms corresponding to the bottom mode in FIG. 5. In one embodiment, while the battery module operates in the bottom mode (corresponding to the battery module 100[1]), in the daisy chain downstream step, when the downstream input terminal tT2B of the battery module 100[1] switches to the downstream enabling level (event E12), it is determined that the daisy chain enabling procedure finishes.

In one embodiment, after each of the battery modules of the battery system 1000 finishes the mode determining step, the upstream step and the downstream step, the bottom battery control circuit 110[1] informs the master control circuit 200 through a communication port, such as I2C or SPI, that the daisy chain enabling procedure has been finished.

Figure 7:
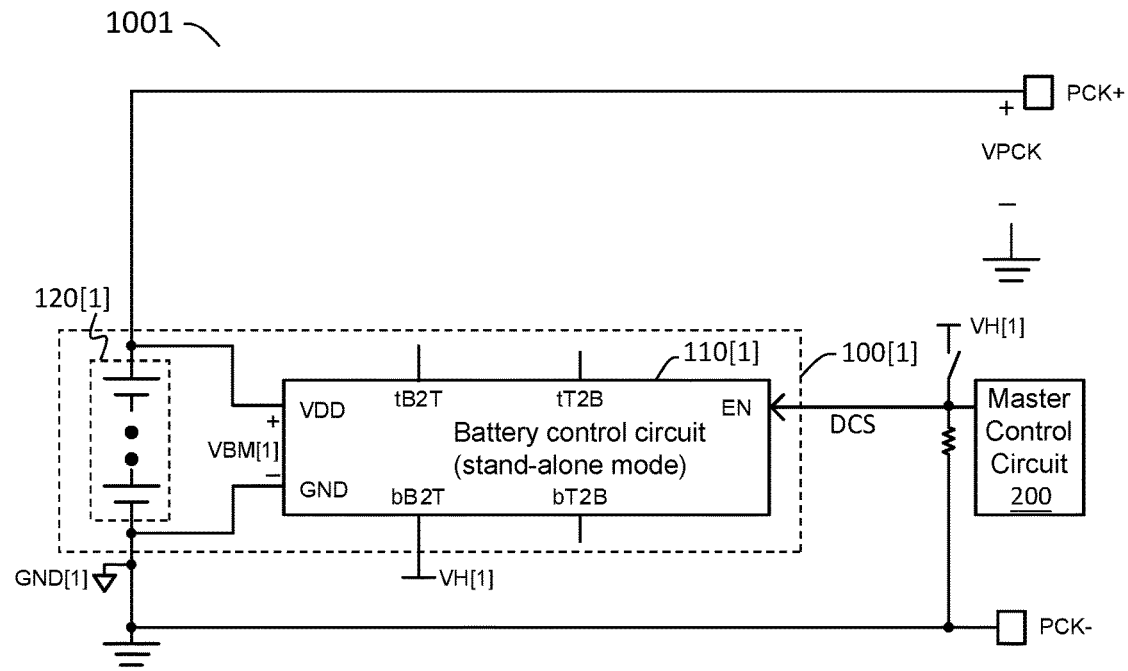
FIG. 7 shows an embodiment of a battery system according to the present invention.

Please refer to FIG. 6C and FIG. 7. FIG. 7 shows an embodiment of a battery system (battery system 1001) according to the present invention. As shown in FIG. 7, in one embodiment, the battery system 1001 includes only one battery module 100[1]. This embodiment is a particular example in the embodiment of FIG. 3, wherein n=1. In this embodiment, the battery module 100[1] can operate in a stand-alone mode during the enabled state. Specifically, during the enabled state, the battery module 100[1] enters the mode determining step. As shown in FIG. 7, in the mode determining step, when the enable terminal EN of the battery control circuit 110[1] is at the enabling level, and the upstream input terminal bB2T is at the upstream enabling level (i.e. VH[1], S22), it is determined that the battery module 100[1] operates in the stand-alone mode (step S28).

Next, when the battery module 100[1] is determined operating in the stand-alone mode, in one embodiment, the battery control circuit 110[1] informs the master control circuit 200 through a communication port such as I2C or SPI, that the daisy chain enabling procedure has been finished.

Figure 8:
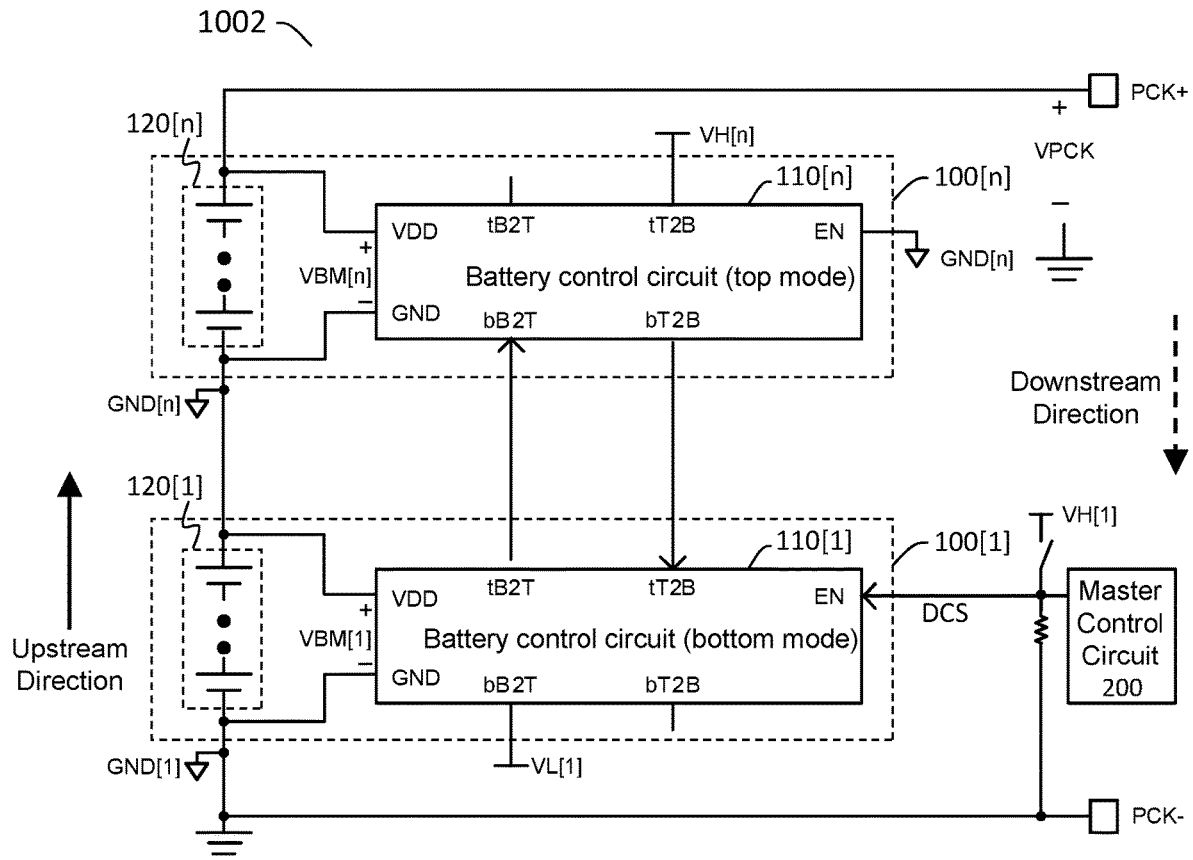
FIG. 8 shows an embodiment of a battery system according to the present invention.

Please refer to FIG. 8. FIG. 8 shows an embodiment of a battery system (battery system 1002) according to the present invention. As shown in FIG. 8, in one embodiment, the battery system 1002 includes the battery modules 100[1]~100[n], wherein n=2 in this case. This embodiment is a particular example in the embodiment of FIG. 3 (wherein n=2), so it includes only one bottom battery module 100[1] and one top battery module 100[n]. In other words, the battery system 1002 does not include any battery module which is in the middle mode. The battery control circuit 110[n] of the top battery module 100[n] corresponds to a top battery control circuit, and the battery control circuit 110[1] of the bottom battery module 100[1] corresponds to a bottom battery control circuit.

In this embodiment, the bottom battery module 100[1] and the top battery module 100[n] are coupled to form a daisy chain. The upstream output terminal tB2T of the bottom battery control circuit 110[1] is coupled to the upstream input terminal bB2T of the top battery control circuit 110[n]; and the downstream output terminal bT2B of the top battery control circuit 110[n] is coupled to the downstream input terminal tT2B of the bottom battery control circuit 110[1].

All the battery units 120[1]~120[n] of the plural battery modules 100[1]~100[n] are connected in series to generate a battery system voltage VPCK between a battery output positive terminal PCK+ and a battery output negative terminal PCK− of the battery system 1002.

The enable terminal EN of the bottom battery control circuit 110[1] receives a daisy chain starting signal DCS from a master control circuit 200. When the daisy chain starting signal DCS switches to the operation enabling level, a daisy chain enabling procedure is started. The upstream input terminal bB2T of the bottom battery control circuit 110[1] is coupled to a reference voltage (VL[1]) which is at the upstream disabling level.

With regard to the mode determining step, the upstream step and the downstream step of this embodiment, please refer to the operations of the top battery module and the bottom battery module in the other embodiments.

Figure 9:
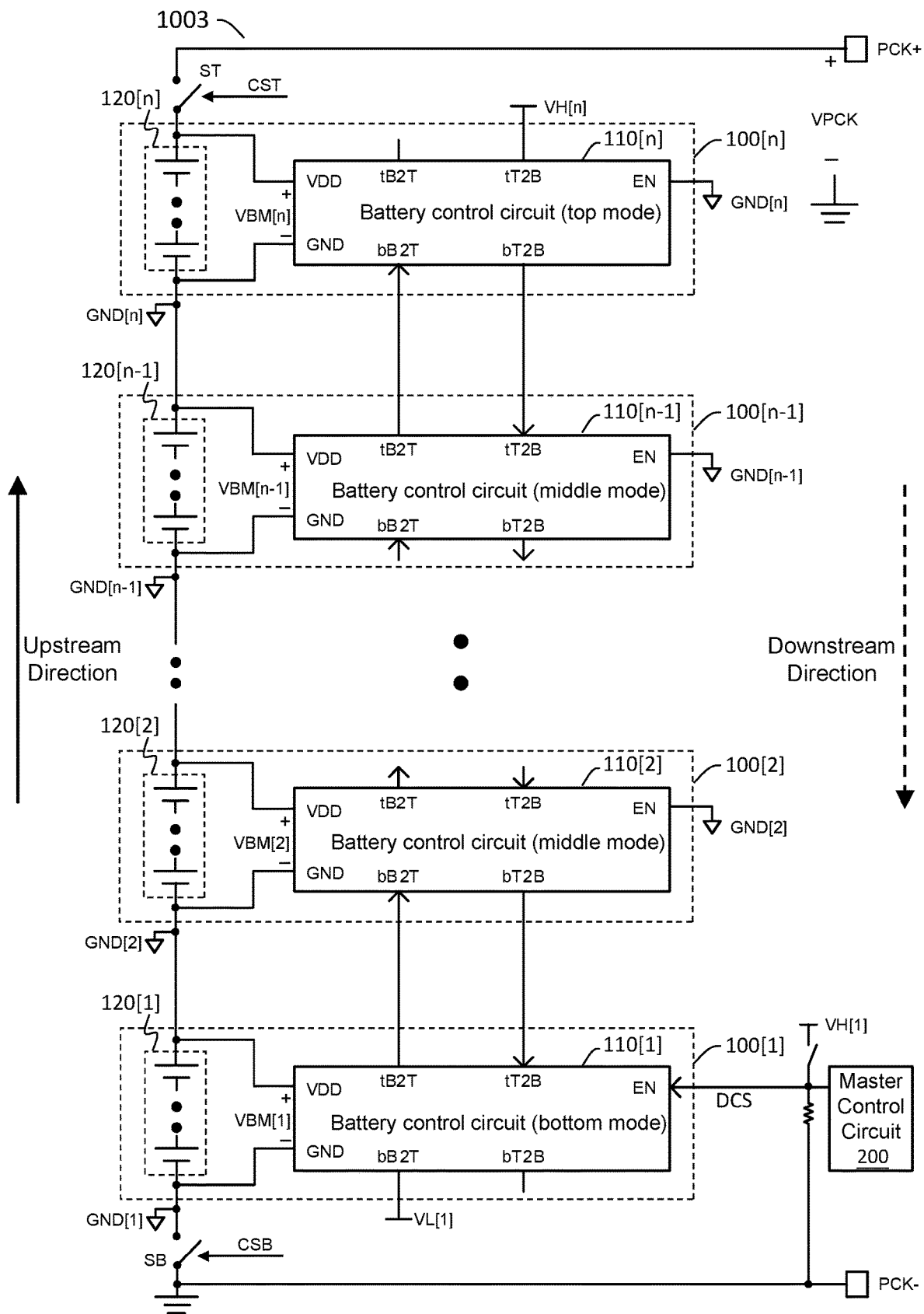
FIG. 9 shows an embodiment of a battery system according to the present invention.

Please refer to FIG. 9. FIG. 9 shows an embodiment of a battery system (battery system 1003) according to the present invention. As shown in FIG. 9, in one embodiment, the battery system 1003 further includes a top switch ST and a bottom switch SB. In one embodiment, each of the battery units 120[1]~120[n] of the battery modules 100[1]~100[n] includes plural batteries which are connected in series. Each of the battery control circuits 110[1]~110[n] monitors the voltage of each battery of the corresponding battery unit 120[1]~120[n]. When at least one battery of any battery unit having a voltage higher than a voltage upper limit or lower than a voltage lower limit, the battery control circuit generates a protection signal (to conduct an over voltage protection in charging or an under voltage protection in discharging). In one embodiment, the battery control circuit transmits the protection signal to the battery module which is in the bottom mode (such as 100[1]) through the downstream input terminal(s) tT2B and the downstream output terminal(s) bT2B to turn off the electrical connection between the battery system 1003 and its exterior. Alternatively, the battery control circuit transmits the protection signal to the battery module which is in the top mode (such as 100[n]) through the upstream input terminal(s) bB2T and the upstream output terminal(s) tB2T to turn off the electrical connection between the battery system 1003 and its exterior. Specifically, the electrical connection between the battery system 1003 and its exterior may be turned off by for example, generating a control signal CSB by the battery module which is in the bottom mode (such as 100[1]) or by the master control circuit 200 to turn off the bottom switch SB, and/or generating a control signal CST by the battery module which is in the top mode (such as 100[n]) or by the master control circuit 200 to turn off the top switch ST.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A battery module, for use in a battery system which is configured to be operable in a bottom mode or a top mode during an enabled state, the battery module comprising:
   a battery unit, including at least one battery, wherein the battery unit generates a battery unit voltage between a positive terminal and a negative terminal of the battery unit; and
   a battery control circuit, powered by the battery unit voltage and configured to operably detect the battery unit voltage and/or to control the battery unit, wherein the battery control circuit includes an enable terminal, an upstream input terminal, an upstream output terminal, a downstream input terminal, and a downstream output terminal;
   wherein when the upstream input terminal is at an upstream enabling level, the battery module enters the enabled state.

2. The battery module of claim 1, wherein when the enable terminal is at an operation enabling level, the battery module enters the enabled state.

3. The battery module of claim 1, wherein the battery unit includes plural batteries which are connected in series, wherein the battery control circuit performs a voltage balancing control on the batteries of the battery unit, such that the batteries of the battery unit achieve a voltage-balanced state.

4. The battery module of claim 1, wherein the battery module enters a mode determining step in the enabled state, wherein in the mode determining step:
   when the enable terminal is at an operation enabling level and the upstream input terminal is at an upstream disabling level, the battery module is determined to be operating in the bottom mode; or
   when the enable terminal is at an operation disabling level, the upstream input terminal is at the upstream enabling level, and the downstream input terminal is at a downstream enabling level, the battery module is determined to be operating in the top mode.

5. The battery module of claim 4, wherein the battery module is further configured to be operable in a stand-alone mode during the enabled state, wherein in the mode determining step:
   when the enable terminal is at the operation enabling level, and the upstream input terminal is at the upstream enabling level, the battery module is determined to be operating in the stand-alone mode.

6. The battery module of claim 4, wherein the battery module is further configured to be operable in a middle mode during the enabled state, wherein in the mode determining step:
   when the enable terminal is at the operation disabling level, the upstream input terminal is at the upstream enabling level, and the downstream input terminal is at a downstream disabling level, the battery module is determined to be operating in the middle mode.

7. The battery module of claim 6, wherein after the mode determining step, the battery control circuit conducts a daisy chain upstream step and a daisy chain downstream step;
   wherein in the daisy chain upstream step, when the battery module operates in the bottom mode or the middle mode, the upstream output terminal switches to the upstream enabling level;
   after the daisy chain upstream step, the battery control circuit conducts the daisy chain downstream step;
   wherein in the daisy chain downstream step:
      when the battery module operates in the top mode, the downstream output terminal switches to the downstream enabling level; or
      when the battery module operates in the middle mode, and the downstream input terminal is at a downstream enabling level, the downstream output terminal switches to the downstream enabling level.

8. The battery module of claim 6, wherein the battery unit includes plural batteries which are connected in series, wherein the battery control circuit monitors a voltage of each battery of the battery unit, and when at least one battery of the battery unit has a voltage higher than a voltage upper limit or lower than a voltage lower limit, the battery control circuit generates a protection signal;
   wherein the battery control circuit transmits the protection signal to a battery module which is in the bottom mode through the downstream input terminal and the downstream output terminal to turn off an electrical connection between the battery system and an exterior of the battery system; or
   the battery control circuit transmits the protection signal to a battery module which is in the top mode through the upstream input terminal and the upstream output terminal to turn off an electrical connection between the battery system and the exterior of the battery system.

9. A battery system, comprising plural battery modules which operate respectively in a bottom mode, a top mode and a middle mode during an enabled state; wherein the plural battery modules include a bottom battery module, a top battery module and at least one middle battery module; wherein the bottom battery module is configured to be operable in the bottom mode, the top battery module is configured to be operable in the top mode, and the at least one middle battery module is configured to be operable in the middle mode; wherein each of the plural battery modules includes:
   a battery unit, including at least a battery, wherein the battery unit generates a battery unit voltage between a positive terminal and a negative terminal of the battery unit; and a battery control circuit, powered by the battery unit voltage and configured to operably detect the battery unit voltage and/or to control the battery unit, wherein the battery control circuit includes an enable terminal, an upstream input terminal, an upstream output terminal, a downstream input terminal, and a downstream output terminal;

wherein when the upstream input terminal is at an upstream enabling level, the battery module enters the enabled state;

wherein the battery module enters a mode determining step during the enabled state, wherein in the mode determining step:

when the enable terminal is at an operation enabling level and the upstream input terminal is at an upstream disabling level, the battery module is determined to be operating in the bottom mode;

when the enable terminal is at an operation disabling level, the upstream input terminal is at the upstream enabling level, and the downstream input terminal is at a downstream enabling level, the battery module is determined to be operating in the top mode; or when the enable terminal is at the operation disabling level, the upstream input terminal is at the upstream enabling level, and the downstream input terminal is at a downstream disabling level, the battery module is determined to be operating in the middle mode;

wherein after the mode determining step, the battery control circuit conducts a daisy chain upstream step and a daisy chain downstream step;

wherein in the daisy chain upstream step, when one of the plural battery modules is determined to be operating in the bottom mode or the middle mode, the upstream output terminal of said one battery module switches to the upstream enabling level; after the daisy chain upstream step, the battery control circuit conducts the daisy chain downstream step;

wherein in the daisy chain downstream step:

when said one battery module operates in the top mode, the downstream output terminal of said one battery module switches to the downstream enabling level; or when said one battery module operates in the middle mode, and the downstream input terminal of said one battery module is at a downstream enabling level, the downstream output terminal of said one battery module switches to the downstream enabling level;

wherein the bottom battery module, the at least one middle battery module and the top battery module are coupled in sequence to form a daisy chain;

wherein in the bottom battery module and at least one middle battery module, the upstream output terminal of each battery control circuit is coupled to the upstream input terminal of a neighboring battery control circuit in an upstream direction;

wherein in the top battery module and at least one middle battery module, the downstream output terminal of each battery control circuit is coupled to the downstream input terminal of a neighboring battery control circuit in an downstream direction;

wherein all the battery units of the plural battery modules are connected in series to generate a battery system voltage between a battery output positive terminal and a battery output negative terminal of the battery system;

wherein the battery control circuit of the bottom battery module corresponds to a bottom battery control circuit, and the enable terminal of the bottom battery control circuit is configured to receive a daisy chain starting signal from a master control circuit, wherein when the daisy chain starting signal switches to the operation enabling level, a daisy chain enabling procedure is started; and the upstream input terminal of the bottom battery control circuit is coupled to a reference voltage which is at the upstream disabling level;

wherein after each battery module of the battery system finishes the mode determining step, the upstream step and the downstream step, the bottom battery control circuit informs the master control circuit that the daisy chain enabling procedure has finished.

10. The battery system of claim 9, wherein each battery unit of the battery system includes plural batteries which are connected in series, wherein each battery control circuit performs a voltage balancing control on the batteries of the corresponding battery unit, such that the batteries of the battery unit achieve a voltage-balanced state.

11. The battery system of claim 9, wherein the battery unit of each battery module of the battery system includes plural batteries which are connected in series, wherein each battery control circuit performs a voltage balancing control on the batteries of the corresponding battery unit, such that the batteries of the battery unit achieve a voltage-balanced state and the battery units of the plural battery modules achieve a voltage-balanced state.

12. The battery system of claim 9, wherein each battery unit of the battery system includes plural batteries which are connected in series, wherein each battery control circuit monitors a voltage of each battery of the corresponding battery unit, and when at least one battery of the battery unit has a voltage higher than a voltage upper limit or lower than a voltage lower limit, the battery control circuit generates a protection signal;

wherein the battery control circuit transmits the protection signal to a battery module which is in the bottom mode through the downstream input terminal and the downstream output terminal to turn off an electrical connection between the battery system and the exterior of the battery system; or the battery control circuit transmits the protection signal to a battery module which is in the top mode through the upstream input terminal and the upstream output terminal to turn off an electrical connection between the battery system and an exterior of the battery system.

13. A battery system, comprising plural battery modules which operate respectively in a bottom mode and a top mode during an enabled state; wherein the plural battery modules include a bottom battery module and a top battery module; wherein the bottom battery module is configured to be operable in the bottom mode, and the top battery module is configured to be operable in the top mode; wherein each of the plural battery modules includes:

a battery unit, including at least one battery, wherein the battery unit generates a battery unit voltage between a positive terminal and a negative terminal of the battery unit; and a battery control circuit, powered by the battery unit voltage and configured to operably detect the battery unit voltage and/or to control the battery unit, wherein the battery control circuit includes an enable terminal, an upstream input terminal, an upstream output terminal, a downstream input terminal, and a downstream output terminal, and when the upstream input terminal is at an upstream enabling level, the battery module enters the enabled state;

wherein the battery module enters a mode determining step during the enabled state, wherein in the mode determining step:
  when the enable terminal is at the operation enabling level and the upstream input terminal is at an upstream disabling level, the battery module is determined to be operating in the bottom mode; or
  when the enable terminal is at an operation disabling level, the upstream input terminal is at the upstream enabling level, and the downstream input terminal is at a downstream enabling level, the battery module is determined to be operating in the top mode;
wherein after the mode determining step, the battery control circuit conducts a daisy chain upstream step and a daisy chain downstream step;
wherein in the daisy chain upstream step, when the battery module operates in the bottom mode, the upstream output terminal switches to the upstream enabling level; after the daisy chain upstream step, the battery control circuit conducts the daisy chain downstream step;
wherein in the daisy chain downstream step:
  when the battery module operates in the top mode, the downstream output terminal switches to the downstream enabling level;
wherein the battery control circuit of the top battery module corresponds to a top battery control circuit, wherein the battery control circuit of the bottom battery module corresponds to a bottom battery control circuit;
wherein the bottom battery module and the top battery module are coupled to form a daisy chain;
wherein the upstream output terminal of the bottom battery control circuit is coupled to the upstream input terminal of the top battery control circuit; wherein the downstream output terminal of the top battery control circuit is coupled to the downstream input terminal of the bottom battery control circuit;
wherein the battery units of the plural battery modules are connected in series to generate a battery system voltage between a battery output positive terminal and a battery output negative terminal of the battery system;
wherein the enable terminal of the bottom battery control circuit is configured to receive a daisy chain starting signal from a master control circuit, wherein when the daisy chain starting signal switches to the operation enabling level, a daisy chain enabling procedure is started; and the upstream input terminal of the bottom battery control circuit is coupled to a reference voltage which is at the upstream disabling level;
wherein after each battery module of the battery system finishes the mode determining step, the upstream step and the downstream step, the bottom battery control circuit informs the master control circuit that the daisy chain enabling procedure has finished.

14. A battery control circuit, for use in a battery module which is configured to be operable in a bottom mode or a top mode during an enabled state, wherein the battery module includes a battery unit which includes at least one battery, wherein the battery unit generates a battery unit voltage between a positive terminal and a negative terminal of the battery unit;
wherein the battery control circuit is powered by the battery unit voltage and configured to operably detect the battery unit voltage and/or to control the battery unit;
wherein the battery control circuit includes an enable terminal, an upstream input terminal, an upstream output terminal, a downstream input terminal, and a downstream output terminal;
wherein when the upstream input terminal is at an upstream enabling level, the battery module enters the enabled state.

15. The battery control circuit of claim 14, wherein the battery module enters a mode determining step in the enabled state, wherein in the mode determining step:
  when the enable terminal is at the operation enabling level, the upstream input terminal is at an upstream disabling level, and the downstream input terminal is at a downstream disabling level, the battery control circuit determines that the battery module operates in the bottom mode; or
  when the enable terminal is at the operation disabling level, the upstream input terminal is at the upstream enabling level, and the downstream input terminal is at a downstream enabling level, the battery control circuit determines that the battery module operates in the top mode.

16. The battery control circuit of claim 15, wherein the battery module is further configured to be operable in a middle mode during the enabled state, wherein in the mode determining step:
  when the enable terminal is at an operation disabling level, the upstream input terminal is at the upstream enabling level, and the downstream input terminal is at a downstream disabling level, the battery control circuit determines that the battery module operates in the middle mode.

17. The battery control circuit of claim 16, wherein after the mode determining step, the battery control circuit conducts a daisy chain upstream step and a daisy chain downstream step;
wherein in the daisy chain upstream step, when the battery module operates in the bottom mode or the middle mode, the upstream output terminal switches to the upstream enabling level;
after the daisy chain upstream step, the battery control circuit conducts the daisy chain downstream step;
wherein in the daisy chain downstream step:
  when the battery module operates in the top mode, the downstream output terminal switches to the downstream enabling level;
when the battery module operates in the middle mode, and the downstream input terminal is at a downstream enabling level, the downstream output terminal switches to the downstream enabling level.

18. The battery control circuit of claim 14, wherein when the enable terminal is at an operation enabling level, the battery module enters the enabled state.

* * * * *